(12) United States Patent
Sharma et al.

(10) Patent No.: US 12,550,733 B2
(45) Date of Patent: Feb. 10, 2026

(54) MULTIPLE EPITAXIAL LAYER SOURCE AND DRAIN TRANSISTORS FOR LOW TEMPERATURE COMPUTATION

(71) Applicant: Intel Corporation, Santa Clara, CA (US)

(72) Inventors: Abhishek Sharma, Portland, OR (US); Wilfred Gomes, Portland, OR (US); Anand Murthy, Portland, OR (US); Tahir Ghani, Portland, OR (US); Jack Kavalieros, Portland, OR (US); Rajabali Koduri, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 17/711,848

(22) Filed: Apr. 1, 2022

(65) Prior Publication Data

US 2023/0317558 A1   Oct. 5, 2023

(51) Int. Cl.
  *H01L 23/473*   (2006.01)
  *H10D 30/67*    (2025.01)
  *H10D 62/10*    (2025.01)

(52) U.S. Cl.
  CPC ....... *H01L 23/473* (2013.01); *H10D 30/6735* (2025.01); *H10D 62/121* (2025.01)

(58) Field of Classification Search
  CPC ............ H10D 30/6735; H10D 62/121; H10D 30/797; H10D 30/6757; H01L 23/473; H01L 23/427
  See application file for complete search history.

(56) References Cited

U.S. PATENT DOCUMENTS

| | | | |
|---|---|---|---|
| 2005/0139936 A1* | 6/2005 | Li | H10D 62/8325 257/408 |
| 2010/0252869 A1* | 10/2010 | Hokazono | H10D 84/017 257/E21.409 |
| 2012/0196412 A1* | 8/2012 | Chen | H10D 62/021 257/E21.634 |
| 2017/0012124 A1* | 1/2017 | Glass | H10D 30/797 |
| 2021/0366819 A1* | 11/2021 | Chiang | H01L 23/3675 |

* cited by examiner

*Primary Examiner* — Changhyun Yi
(74) *Attorney, Agent, or Firm* — Essential Patents Group, LLP

(57) ABSTRACT

Integrated circuit dies, systems, and techniques are described related to multiple transistor epitaxial layer source and drain transistor circuits operable at low temperatures. A system includes an integrated circuit die having a number of transistors each having a crystalline channel structure, a first layer epitaxial to the channel structure, and a second layer epitaxial to the first layer. The system further includes a cooling structure integral to the integrated circuit die, coupled to the integrated circuit die, or both. The cooling structure is operable to remove heat from the integrated circuit die to achieve an operating temperature at the desired low temperature.

23 Claims, 12 Drawing Sheets

MULTIPLE EPITAXIAL LAYER SOURCE AND DRAIN TRANSISTORS FOR LOW
TEMPERATURE COMPUTATION

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on.

In typical implementations, computational systems are deployed within a temperature range inclusive of room temperature. However, there is a growing desire to deploy such systems at low temperature to meet the needs for increased computational capabilities as discussed above. It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
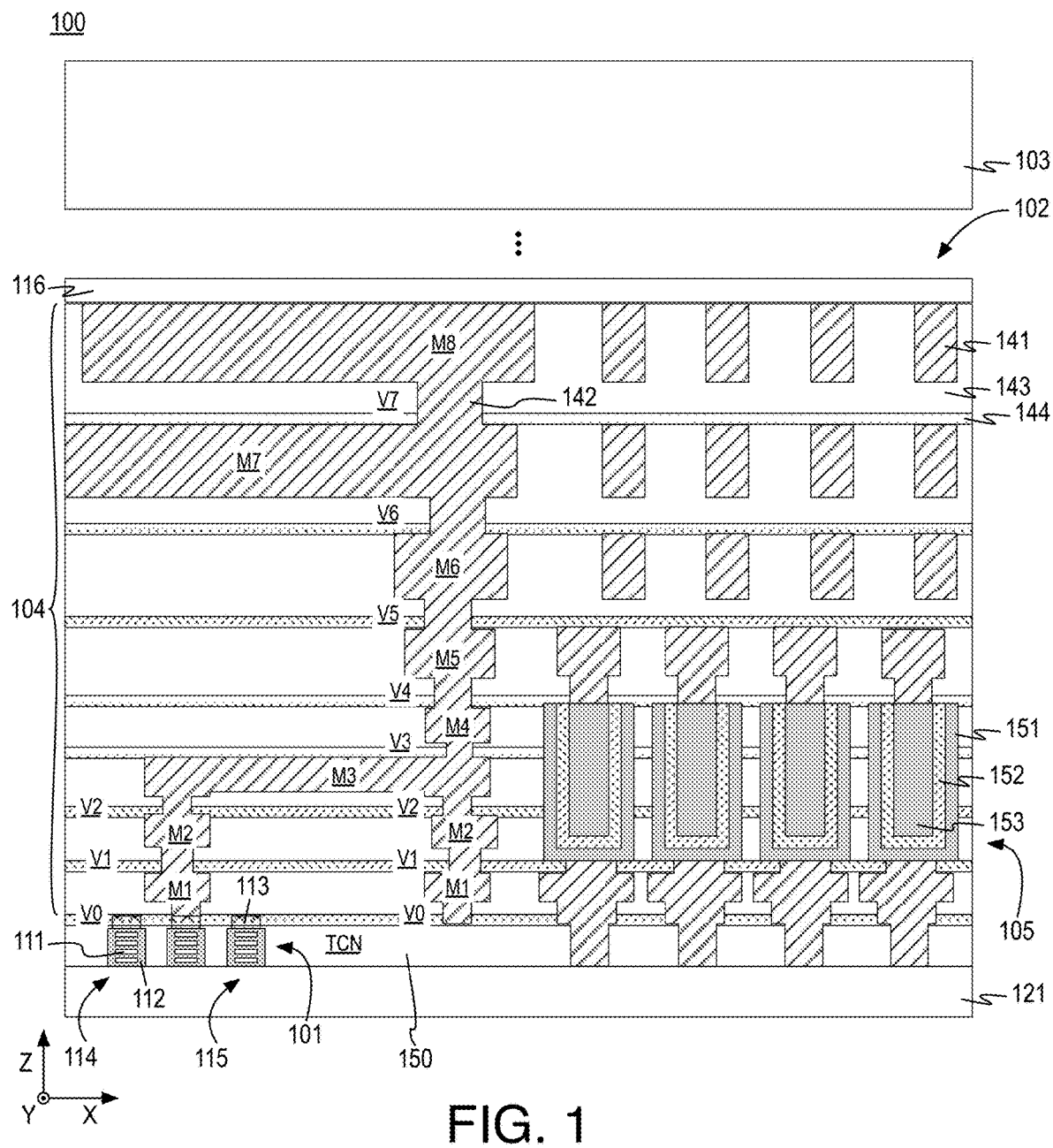
FIG. 1 illustrates a cross-sectional view of a low temperature multiple epitaxial layer source and drain transistor integrated circuit system.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Integrated circuit dies, systems, and techniques are described herein related to multiple epitaxial layer source and drain transistor devices operable at very low temperatures for improved device performance.

As discussed, typical computational systems are deployed within a temperature range inclusive of room temperature (e.g., about 20 to 25° C.). However, there is a growing desire to deploy computational systems at very low temperatures. In some embodiments, an apparatus or device includes an integrated circuit (IC) die having a number of transistors, one or more of which have a channel structure of crystalline silicon, a source and a drain coupled to the channel structure and a gate structure between the source and the drain. The source and/or the drain advantageously include two or more layers epitaxial to the channel structure such that a first layer is epitaxial to the channel structure and a second layer is epitaxial to the first layer and such that the first layer is crystalline silicon or crystalline silicon carbide, and the second layer is crystalline germanium or crystalline silicon germanium. As discussed further herein, in some embodiments, the first layer is advantageously a wider band gap material than the second layer.

The multiple epitaxial layer source and drain transistors discussed herein may be deployed in any suitable context inclusive of complementary metal oxide semiconductor (CMOS) applications (e.g., with one or both of the conductivity type transistors including multiple epitaxial layer sources and drains) or single MOS (e.g., with only one conductivity type, n-type (NMOS) or p-type (PMOS) transistors). Furthermore, the multiple epitaxial layer source and drain transistors may be used in any application such as logic applications, memory applications, etc. In some embodiments, the multiple epitaxial layer source and drain transistors are deployed as select transistors in dynamic random access memory (DRAM) applications which further include memory capacitors. However, the transistor structures are not limited to such DRAM applications. The devices and systems discussed herein advantageously deploy transistors having crystalline silicon channel structures and multiple epitaxial layer source and drain for use at very low temperatures.

At such very low temperatures, the transistors have very low leakage and high performance inclusive of greater mobility and higher drive currents. Furthermore, use of multiple epitaxial layer source and drain (e.g., two layers of epitaxial layers, or epi) can advantageously further reduce leakage. For example, such multiple epitaxial layer source and drain increases the effective gate length (Leff) of the transistor due to the carriers having to travel not just across the gate but across the gate, across the first epitaxial layer, across the second epitaxial layer, and the interfaces between such materials. Such multiple epitaxial layer source and drain also improves the electrostatics of the device, which may be lost as devices continue to scale to smaller and smaller sizes. By deploying multiple epitaxial layer source and drain and operating the transistors at very low temperature, high performance is attained inclusive of improved gate control and ultra-low leakage. Use of both multiple epitaxial layer source and drain and very low temperature are critical to such improvements as movement of the source and drain contacts reduces tunneling effects (which are temperature independent, at least to the first order) while very low temperature provides the discussed performance enhancements.

The multiple epitaxial layer source and drain transistors may be implemented in planar or non-planar transistors, with non-planar transistors being illustrated herein. As used herein, a planar transistor indicates a transistor having a single plane interface between the gate and channel structure thereof. The term non-planar transistor indicates a transistor having more than a single plane interface between the gate and channel structure. Such non-planar transistors may also be characterized as multi-gate devices, multi-gate MOS-FETs, or the like. In some embodiments, the non-planar transistors are Fin FET devices where the gate is on two, three, or four sides of a fin of channel material. In some embodiments, the non-planar transistors are gate all around (GAA) FET devices where the gate surrounds one or more channel regions on all sides. Such channel regions may be nanowires, nanoribbons, or nanosheets of channel material, for example. In some embodiments, the non-planar transistors are recessed channel array transistors (RCATs). Such multiple epitaxial layer source and drain transistors may be deployed in a functional circuit block, as part of an integrated circuit, etc. As used herein the term functional circuit block indicates a multiple transistor circuit deployed to perform one or more circuit functions.

As discussed, the IC die including multiple epitaxial layer source and drain transistors are deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on.

In operation at very low temperatures, the multiple epitaxial layer source and drain transistors see a substantial boost in performance relative to operation at higher temperatures. In particular, multiple epitaxial layer source and drain transistors operated at very low temperatures have increased carrier mobility, reduced contact resistance, and reduced leakage. Other advantages will be evident based on the following discussion.

FIG. 1 illustrates a cross-sectional view of a low temperature multiple epitaxial layer source and drain transistor integrated circuit system 100, arranged in accordance with at least some implementations of the present disclosure. In FIG. 1, an orthogonal to gate view is provided such that orthogonal to the gate refers to the gate of multiple epitaxial layer source and drain transistors 101. IC system 100 includes a lateral surface along the x-y plane that may be defined or taken at any vertical position of IC system 100. The lateral surface of the x-y plane is orthogonal to a vertical or build up dimension as defined by the z-axis.

IC system 100 may be formed on and or in any substrate 121 (e.g., substrate material) suitable for the fabrication of transistor circuitry. In some embodiments, a substrate 121 is used to manufacture multiple epitaxial layer source and drain transistors 101 and other components of IC system 100. Semiconductor substrate may include a wafer or other piece of silicon or another semiconductor material. Suitable semiconductor substrates include, but are not limited to, single crystal silicon, poly crystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates. As discussed, substrate 121 may include any suitable material or materials. For example, substrate 121 may be a substrate substantially aligned along a predetermined crystal orientation (e.g., (100), (111), (110), or the like). In some examples, substrate 121 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 121 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 121 may be (111) silicon, (100) silicon, or (110) silicon. In an embodiment, substrate 121 includes a (111) crystalline group IV material.

In FIG. 1, IC system 100 includes an IC die 102, which is a monolithic integrated circuit including multiple epitaxial layer source and drain transistors 101, front-side metallization layers 104 (or front-side interconnect layers), and capacitors 105. IC die 102 may also include optional back-side metallization layers in the negative z-direction relative to multiple epitaxial layer source and drain transistors 101 (not shown). In some embodiments, such back-side metallization layers are formed by removal of substrate 121 as is known in the art. IC system 100 further includes a package level cooling structure 103, which may be deployed on or over front-side metallization layers 104 (as shown) or on or over a back-side of IC die 102 (as illustrated elsewhere herein). In some embodiments, package level cooling structure 103 is coupled to IC die 102 by an adhesion layer 116. Adhesion layer 116 may be formed on the front-side of IC die 102 (as shown) or on or over a back-side of IC die 102 (as illustrated elsewhere herein). In some embodiments, package level cooling structure 103 is provided proximal to, but not necessarily directly on, IC die 102. For example, IC die 102 may be deployed as part of a multi-chip stack or multi-chip package and package level cooling structure 103 may be provided on or over another die in the stack.

Multiple epitaxial layer source and drain transistors 101 deploy a source and/or a drain having two or more epitaxial materials as illustrated further herein below. Notably, the source and drain of multiple epitaxial layer source and drain transistors 101 are not shown in the gate cut of FIG. 1. As shown, each of multiple epitaxial layer source and drain transistors 101 include one or more channel structures 111 (or channel regions), gate structures 112, and gate contacts 113. Each of multiple epitaxial layer source and drain transistors 101 also include source and drain structures, and source and drain contacts, which, as discussed, are not shown in the cross-section of FIG. 1. Such source and drain structures are illustrated herein below. In the example of FIG. 1, nanosheet transistors are illustrated. However, IC system 100 may deploy any of planar FETs, Fin FETs, GAA FETs (inclusive of nanowire FETs and nanosheet FETs), RCATs, or other architectures. Multiple epitaxial layer source and drain transistors 101 may be single MOS or CMOS. In some embodiments, multiple epitaxial layer source and drain transistors 101 include a PMOS transistor 114 (i.e., having p-type source and drain materials) and an NMOS transistor 115 (i.e., having n-type source and drain materials).

Channel structures 111 may also be characterized as channel material or, simply, a channel. Multiple epitaxial layer source and drain transistors 101 each include one or more channel structures 111 between source and drain structures (e.g., source and drain semiconductors). In the context of NMOS transistors, the source and drain structures are n-type semiconductor materials. In such NMOS transistor context, the transistors may be inversion type such that channel structures 111 are p-type semiconductor materials. During operation, such p-type semiconductor materials may be inverted under control of gate structures 112 to provide an inversion layer for the conduction of electrons between the n-type source and drain materials. In the context of PMOS transistors, the source and drain structures are intrinsic or p-type semiconductor materials. In such PMOS transistor context, the transistors may be inversion type such that channel structures 111 are n-type semiconductor materials and, an inversion layer for the conduction of holes between the p-type source and drain materials is provided under control of gate structures 112.

Gate structures 112 may include a gate dielectric layer on at least portions of channel structures 111 such that the gate dielectric layer is between channel structures 111 and a gate electrode of gate structures 112. During operation, the gate electrode controls channel structures 111. As shown, multiple epitaxial layer source and drain transistors 101 are embedded within dielectric material 150.

Interconnectivity of multiple epitaxial layer source and drain transistors 101, signal routing to and from multiple epitaxial layer source and drain transistors 101, power delivery to multiple epitaxial layer source and drain transistors 101, and routing to an outside device (not shown) are provided by front-side metallization layers 104 (and optional back-side metallization layers, if used). As used herein, the term metallization layer indicates metal interconnections or wires that provide electrical routing. Adjacent metallization layers, such as metallization interconnects 141, are interconnected by vias, such as vias 142, that may be characterized as part of the metallization layers or between the metallization layers. As shown, in some embodiments, front-side metallization layers 104 are formed over and immediately adjacent to multiple epitaxial layer source and drain transistors 101. As used herein, the term front- and back-side are used in their ordinary meaning in the art based on the build up direction of IC die 102 with the front-side being the side exposed during processing of the substrate used to fabricate multiple epitaxial layer source and drain transistors 101. The back-side is then the opposite side, which may be exposed during processing by attaching the front-side to a carrier wafer and exposing the back-side (e.g., by back-side grind or etch operations) as known in the art.

In the illustrated example, front-side metallization layers 104 include V0, M1, V1, M2, V2, M3, V3, M4, V4, M5, V6, M7, V7, and M8. However, front-side metallization layers 104 may include any number of metallization layers such as eight or more metallization layers. Front-side metallization layers 104 are embedded within dielectric materials 143, 144. As shown, capacitors 105 are implemented within front-side metallization layers 104. For example, each of capacitors 105 may be a part of a storage node interconnected by front-side metallization layers 104 to one or more of multiple epitaxial layer source and drain transistors 101. Each of capacitors 105 couples a first capacitor plate conductor 151 to a transistor terminal (e.g., a transistor source with a transistor drain coupled to a bit line) of one of multiple epitaxial layer source and drain transistors 101. Capacitors 105 further include another capacitor plate conductor 153 that is separated from capacitor plate conductor 151 by an intervening material 152. Intervening material 152 may be any suitable material for deployment in a capacitor such as a dielectric material or ferroelectric material in various embodiments. Capacitor plate conductor 153 may be continuous across capacitors 105 associated with multiple bit lines and a single word line, for example. Capacitor plate conductors 151, 153 may have any composition known to be suitable for a storage capacitor, such as, for example titanium or titanium nitride (i.e., a material including titanium and nitrogen).

As discussed, IC system 100 includes IC die 102 and a cooling structure operable to remove heat from IC die 102 to achieve a very low operating temperature of IC die 102. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −296° C. may be used. In some embodiments, the operating temperature is in a cryogenic temperature operating window (e.g., about −180° C. to about −70° C.). As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be provided as a package level structure (i.e., separable from IC die 102), as a die level structure (i.e., integral to IC die 102), or both. In some embodiments, an active cooling structure is not needed as IC die 102 is deployed in a cold temperature environment. IC die 102 includes one or more functional circuit blocks. In some embodiments, IC die 102 includes a DRAM system or functional block inclusive of multiple epitaxial layer source and drain transistors 101 and capacitors 105.

Figure 2:
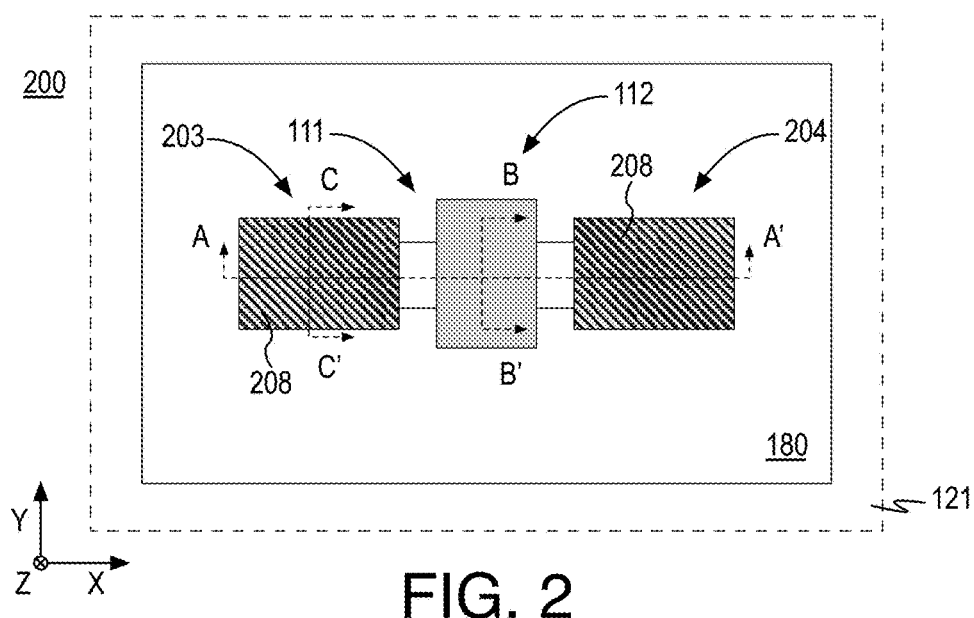
FIG. 2 illustrates a top down view of an example multiple epitaxial layer source and drain transistor for deployment in low temperature integrated circuit systems.

FIG. 2 illustrates a top down view of an example multiple epitaxial layer source and drain transistor 200 for deployment in low temperature integrated circuit systems, arranged in accordance with at least some implementations of the present disclosure. For example, multiple epitaxial layer source and drain transistor 200 may be used as one or more of multiple epitaxial layer source and drain transistors 101. As shown, multiple epitaxial layer source and drain transistor 200 includes a source structure 203, a drain structure 204, and gate structure 112 therebetween. Furthermore, multiple epitaxial layer source and drain transistor 200 may be surrounded by isolation material 180. Isolation material 180 may be any material suitable for providing electrical isolation between transistors. In some exemplary embodiments, isolation material 180 is silicon dioxide. Other materials known to be suitable for the purpose may also be utilized, including low-k materials (e.g., having a relative dielectric constant below 2.5).

Source structure 203, drain structure 204, and gate structure 112 are coupled to channel structure 111. In some embodiments, channel structure 111 is crystalline silicon. As used herein, the term crystalline indicates a material of constituents arranged in a highly ordered structure. A crystalline material may be monocrystalline, though it need not be. Furthermore, as used herein, the one or more atoms listed after the term crystalline indicate atoms that are part of the crystal lattice of the crystalline material, though other dopant materials may also be part of the crystalline material. Therefore, the term crystalline silicon indicates the material includes one or more crystals of silicon, which optionally includes dopant materials. The term crystalline silicon and germanium indicates the material includes one or more crystals of silicon and germanium (i.e., silicon-germanium, or SiGe), which optionally includes dopant materials. The term crystalline silicon and carbon indicates the material includes one or more crystals of silicon and carbon (i.e., silicon carbide, or SiC), which optionally includes dopant materials. In the top down view of FIG. 2, a top layer 208 of multiple layer source structure 203 and multiple layer drain structure 204 is visible.

Figure 3A:
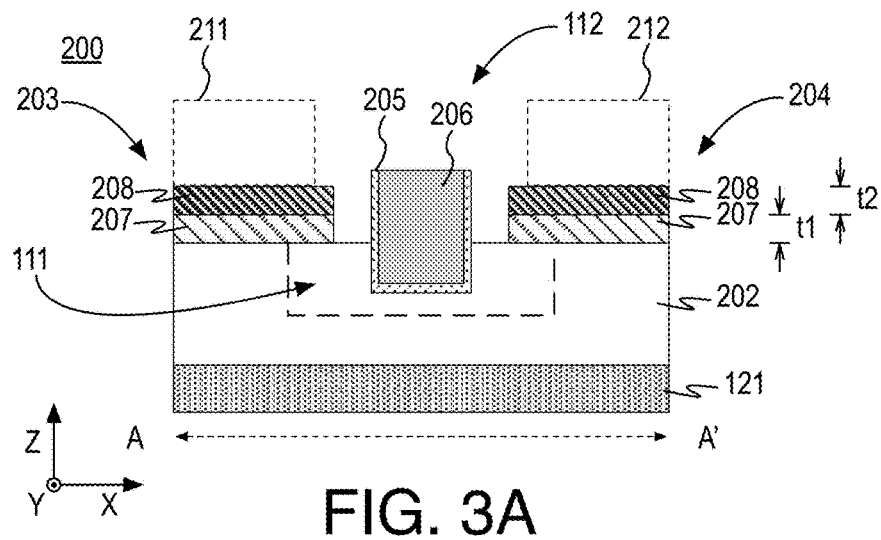
FIG. 3A illustrates a cross-sectional view through a length of the channel structure, source structure, and drain structure of the multiple epitaxial layer source and drain transistor of FIG. 2.
Figures 3B, 3C:
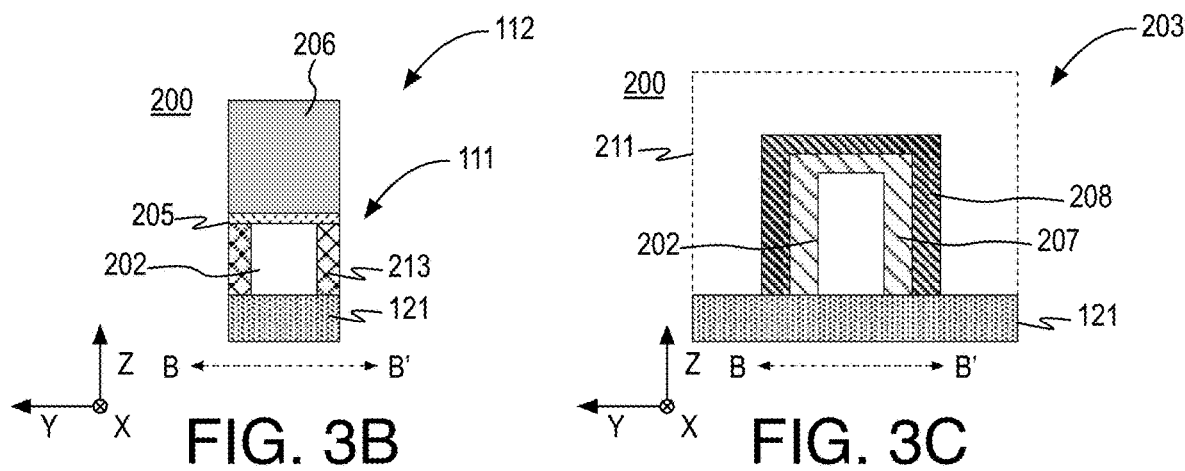
FIG. 3B illustrates a cross-sectional view through a width of the channel structure and gate structure of the multiple epitaxial layer source and drain transistor of FIG. 2.
FIG. 3C illustrates a cross-sectional view through a width of the fin structure and source structure of the multiple epitaxial layer source and drain transistor of FIG. 2.

FIG. 3A illustrates a cross-sectional view through a length of channel structure 111, source structure 203, and drain structure 204 of multiple epitaxial layer source and drain transistor 200 along the A-A' plane shown in FIG. 2, arranged in accordance with at least some implementations of the present disclosure. FIG. 3B illustrates a cross-sectional view through a width of channel structure 111 and gate structure 112 of multiple epitaxial layer source and drain transistor 200 along the B-B' plane shown in FIG. 2, arranged in accordance with at least some implementations of the present disclosure. FIG. 3C illustrates a cross-sectional view through a width of a fin structure 202 and source structure 203 of multiple epitaxial layer source and drain transistor 200 along the C-C' plane shown in FIG. 2, arranged in accordance with at least some implementations of the present disclosure.

As shown in FIG. 3A, multiple epitaxial layer source and drain transistor 200 may include a fin structure 202, a portion of which provides channel structure 111. For example, channel structure 111 may be a portion of fin structure 202 extending between source structure 203 and drain structure 204, and adjacent gate structure 112. For example, in the context of FIGS. 3A, 3B, 3C, multiple epitaxial layer source and drain transistor 200 may be characterized as a recessed channel array transistor RCAT as gate structure 112 is recessed within a portion fin structure 202. Fin structure 202 may include any material discussed with respect to channel structure 111 such as crystalline silicon.

Gate structure 112 may include a gate dielectric 205 and a gate electrode 206. Gate dielectric 205 may include one layer or a stack of layers. The one or more layers of gate dielectric 205 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 205 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate electrode 206 is on the gate dielectric layer and may include of at least one of a p-type work function metal or an n-type work function metal, depending on whether the transistor is a PMOS or an NMOS transistor. In some embodiments, gate electrode 206 is a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a work function that is between about 3.9 eV and about 4.2 eV.

Fin structure 202 of multiple epitaxial layer source and drain transistor 200 provides channel structure 111 that extends between source structure 203 and drain structure 204. Source structure 203 and drain structure 204 may be the opposite conductivity type with respect to channel region 111, as discussed herein. For example, for NMOS transistors, source structure 203 and/or drain structure 204 are n-type materials and, for PMOS transistors, source structure 203 and/or drain structure 204 are p-type materials.

Notably, source structure 203 and drain structure 204 include multiple layers 207, 208 such that layer 207 is epitaxial to channel structure 111 and layer 208 is epitaxial to layer 208. As used herein, the term epitaxial to indicates a layer or material has one or more crystals grown from (and having a crystal lattice match to) the source layer or material. In this context, layer 207 (i.e., a first crystalline material) is a crystalline material grown from and having a crystal lattice match to at least a portion of channel structure 111. Similarly, layer 208 (i.e., a second crystalline material) is a crystalline material grown from and having a crystal lattice match to at least a portion of layer 207. Although illustrated with respect to two layers 207, 208 any multiple number (i.e., two or more) crystalline layers may be deployed.

As shown, multiple epitaxial layer source and drain transistor 200 includes channel structure 111 of crystalline silicon, source structure 203 and drain structure 204 coupled to channel structure 111, and gate structure 112 between source structure 203 and drain structure 204 and coupled to channel structure 111. Source structure 203 and/or drain structure 204 include at least first layer 207 epitaxial to channel structure 111 and second layer 208 epitaxial to first layer 207. In some embodiments, first layer 207 is one of crystalline silicon or crystalline silicon and carbon, and second layer 208 is one of crystalline germanium or crystalline silicon and germanium. For example, first layer 207 may advantageously have a wider bandgap than second layer 208. As used herein, the term bandgap indicates a material property of solid materials defined as an energy range where no electronic states exist. For example, the bandgap may be a difference between the top of a valence band and the bottom of a conduction band of the material. In some embodiments, first layer 207 has the same or a wider bandgap with respect to channel structure 111. In some embodiments, first layer 207 has a wider bandgap than second layer 208 and first layer 207 has a wider bandgap than channel structure 111. As discussed, in some embodiments, first layer 207 is crystalline silicon and carbon. In some embodiments, first layer 207 is crystalline silicon and carbon having a carbon concentration in the range of $10^{15}/cm^3$ to $10^{25}/cm^3$. In some embodiments, first layer 207 is crystalline silicon and carbon having a carbon concentration in the range of $10^{15}/cm^3$ to $10^{20}/cm^3$. In some embodiments, first layer 207 is crystalline silicon and carbon having a carbon concentration in the range of $10^{20}/cm^3$ to $10^{25}/$ cm3. In some embodiments, first layer 207 is crystalline silicon and carbon and second layer 208 is crystalline silicon and germanium.

Notably, the crystalline silicon or crystalline silicon and carbon of first layer 207 and/or the crystalline germanium or crystalline silicon and germanium of second layer 208 may be doped with impurity dopants relevant to the conductivity type of multiple epitaxial layer source and drain transistor 200. For example, for NMOS transistors, first layer 207 and/or second layer 208 may be doped with n-type dopants inclusive of phosphorous, arsenic, and antimony. For PMOS transistors, first layer 207 and/or second layer 208 may be doped with p-type dopants inclusive of boron and gallium. The level or concentration of doping of first layer 207 and/or second layer 208 is referred to as dopant impurity concentration. Layers 207, 208 may also be characterized as doped epitaxial materials or material layers. In some embodiments, layer 207 and/or layer 208 are doped materials with a dopant impurity concentration in the range of $1 \times 10^{19}$ to $5 \times 10^{21}$ $cm^{-3}$. In some embodiments, layer 208 has a dopant impurity concentration greater than a dopant impurity concentration of layer 207. In some embodiments, layer 208 is doped materials with a dopant impurity concentration in the range of $1 \times 10^{19}$ to $5 \times 10^{21}$ $cm^{-3}$. In some embodiments, layer 208 is doped materials with a dopant impurity concentration in the range of $1 \times 10^{20}$ to $5 \times 10^{21}$ $cm^{-3}$. In some embodiments, layer 208 is doped materials with a dopant impurity concentration in the range of $1 \times 10^{21}$ to $5 \times 10^{21}$ $cm^{-3}$. In some embodiments, layer 207 is doped materials with a dopant impurity concentration of not more than $1 \times 10^{20}$ $cm^{-3}$. In some embodiments, layer 207 is doped materials with a dopant impurity concentration of not more than $1 \times 10^{19}$ $cm^{-3}$. In some embodiments, layer 207 is substantially absent dopant impurities. As used herein, the term absent dopant impurities indicates a material has not more than trace amounts (i.e., not more than $1 \times 10^{2}$ $cm^{-3}$).

Layers 207, 208 may have any suitable thicknesses, t1 and t2, respectively. The thicknesses, t1 and t2, of layers 207, 208 may be defined as extending vertically (i.e., in the z-direction, as shown in FIG. 3A) or laterally (i.e., in the y-direction, as shown in FIG. 3C) or in any suitable direction from an underlying material. In some embodiments, layer 207 has a thickness of not less than 2 nm. In some embodiments, layer 207 has a thickness in the range of 2 nm to 4 nm. In some embodiments, layer 207 has a thickness in the range of 3 nm to 5 nm. In some embodiments, layer 208 has a thickness of about 2 nm. In some embodiments, layer 208 has a thickness in the range of 2 nm to 4 nm. In some embodiments, layer 208 has a thickness in the range of 1 nm to 5 nm.

Notably, for each nm of thickness of layers 207, 208, the physical change in gate length is relatively small (i.e., 4 nm). However, the effective gate length (Leff) change is substantial. For example, when layer 207 is silicon carbide, which has a lower k value, a wider bandgap, and a lower conductivity, the effective electrical gate length of layer 207 is about 4 nm (as compared to the physical gate length contribution of 1 nm). As discussed, in typical temperature ranges such electrical property changes would reduce drive current by a degree that any other advantages such as reduced tunneling are obviated. However, at reduced temperature, as provided by an active cooling structure, the greater mobility of the device due to the very low temperature operation provides for increased transistor efficiencies.

As shown in FIG. 3C, in some embodiments, layers 207, 208 wrap around fin structure 202 such that layers 207, 208 are on a top surface of fin structure 202 (i.e., a surface in the x-y plane) and on sidewalls of fin structure 202 that extend from the top surface (i.e., a surface in the x-z plane or a sloped surface extending from the top surface). As shown in FIG. 3C, in some embodiments, a portion of fin structure 202 (i.e., a sub-fin) may be embedded in sub-fin isolation 213. Sub-fin isolation 213 may be any amorphous material suitable for providing electrical isolation between adjacent sub-fins. In some exemplary embodiments, sub-fin isolation 213 is silicon dioxide. Other known dielectric materials may also be employed, including low-k materials. Although embodiments are not limited in this respect, other exemplary materials include carbon-doped oxides, siloxane derivatives, and the like. in FIG. 3B, portions of gate structure 112 (i.e., portions of gate dielectric 205) extend onto a top surface of sub-fin isolation 213. In other examples, gate structure 112 wraps at least partially around fin structure 202.

With reference to FIG. 1, in some embodiments, IC die 102 includes PMOS transistor 114 (i.e., having p-type source and drain materials) and NMOS transistor 115 (i.e., having n-type source and drain materials). In some embodiments, both PMOS transistor 114 and NMOS transistor 115 include multiple source and drain layers as discussed with respect to layers 207, 208. Any materials discussed with respect to layers 207, 208 may be deployed, with the pertinent dopants, in PMOS transistor 114 and NMOS transistor 115. In some embodiments, layer 208 of PMOS transistor 114 advantageously has a greater germanium concentration than a germanium concentration of NMOS transistor 115. In some embodiments, layer 208 of NMOS transistor 115 is crystalline silicon and germanium and layer 208 of PMOS transistor 114 is crystalline germanium. In some embodiments, layer 208 of NMOS transistor 115 is crystalline silicon and germanium and layer 208 of PMOS transistor 114 is crystalline germanium substantially absent silicon. As used herein the term substantially absent indicates a material has not more than trace amounts (i.e., not more than $1 \times 10^{2}$ $cm^{-3}$) of the subject material.

Also as shown in outline in FIGS. 3A and 3C, multiple epitaxial layer source and drain transistor 200 includes source and drain contacts 211, 212 that are on layer 208. Source and drain contacts 211, 212 may also be characterized as source and drain metallizations. Source and drain contacts 211, 212 may be separated from gate structure 112 as shown with, in some embodiments, a gate spacer (not shown) therebetween. Source and drain contacts 211, 212 land on source structure 203 and drain structure 204 (e.g., semiconductor terminals), along with gate contact 113, for access to multiple epitaxial layer source and drain transistor 200.

Figure 4:
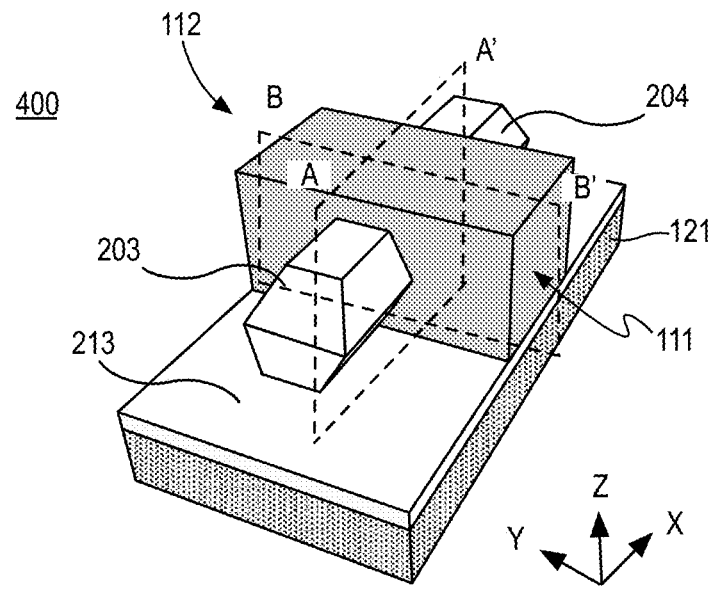
FIG. 4 illustrates an isometric view of an example multiple epitaxial layer source and drain transistor having laterally grown source and drain structures for deployment in low temperature integrated circuit systems.

FIG. 4 illustrates an isometric view of an example multiple epitaxial layer source and drain transistor 400 having laterally grown source and drain structures for deployment in low temperature integrated circuit systems, arranged in accordance with at least some implementations of the present disclosure. For example, multiple epitaxial layer source and drain transistor 400 may be used as one or more of multiple epitaxial layer source and drain transistors 101. Herein, various components and structures are illustrated and described with respect to various multiple epitaxial layer source and drain transistors for the sake of clarity of presentation. It is noted that like components may have the same characteristics across such transistor structures.

As shown, multiple epitaxial layer source and drain transistor 400 includes source structure 203, drain structure 204, and gate structure 112 therebetween such that source structure 203 and drain structure 204 are laterally grown from channel structure(s) 111, which are obscured by gate structure 112 in FIG. 4. source structure 203 and drain structure 204 include multiple epitaxial layers as discussed herein, and as illustrated further herein below, but are illustrated as single components in FIG. 4 for the sake of clarity of presentation. Multiple epitaxial layer source and drain transistor 400 also includes substrate 121 and optional sub-fin isolation 213. Furthermore, multiple epitaxial layer source and drain transistor 400 includes source and drain contacts 211, 212 and gate contact 113 (not shown), as discussed herein.

In the context of multiple epitaxial layer source and drain transistor 400, channel structure(s) 111 extend between source structure 203 and drain structure 204 such that each of source structure 203 and drain structure 204 are on channel structure(s) 111. Furthermore, gate structure 112 (e.g., inclusive of a gate dielectric and a gate electrode) are coupled to channel structure(s) 111. A dielectric material (e.g., a gate sidewall spacer, not shown) is provided between each of source structure 203 and drain structure 204 and gate structure 112 such that source structure 203 and drain structure 204 and gate structure 112 are not shorted.

Figure 5:
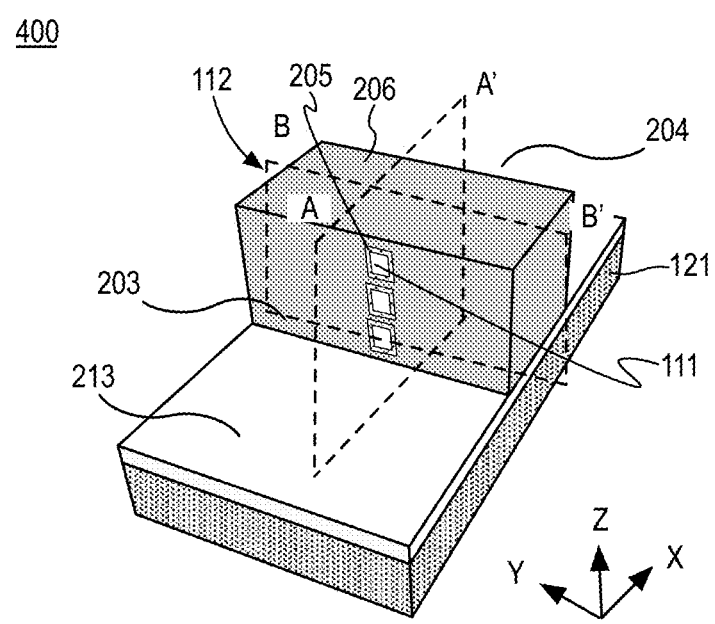
FIG. 5 illustrates an isometric view of the example multiple epitaxial layer source and drain transistor of FIG. 4 with the laterally grown source and drain structures removed to reveal channel structures.
Figure 6A:
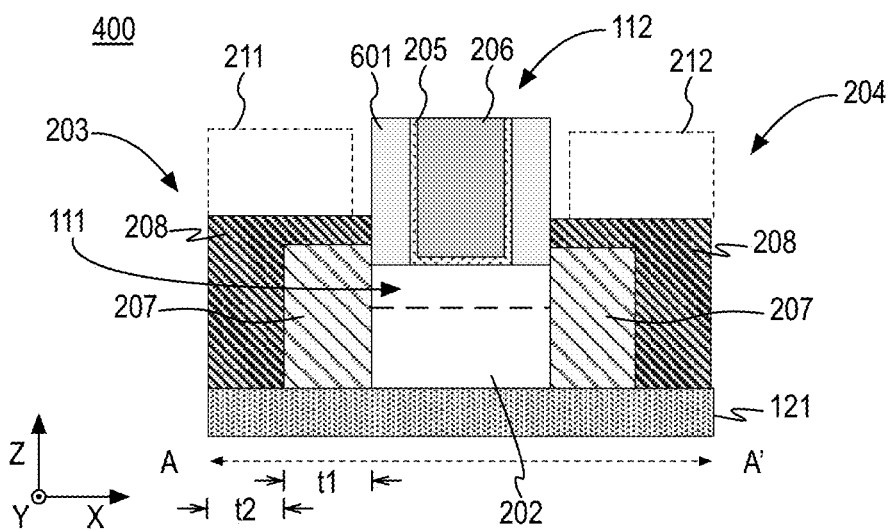
FIG. 6A illustrates a cross-sectional view through a length of the channel structure, source structure, and drain structure of the multiple epitaxial layer source and drain transistor of FIG. 4 having a fin based channel structure.
Figure 6B:
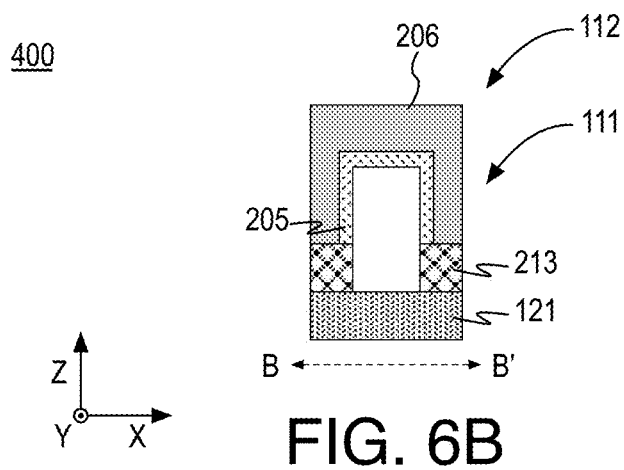
FIG. 6B illustrates a cross-sectional view through a width of the channel structure and gate structure of the multiple epitaxial layer source and drain transistor of FIG. 4 having a fin based channel structure.
Figure 7A:
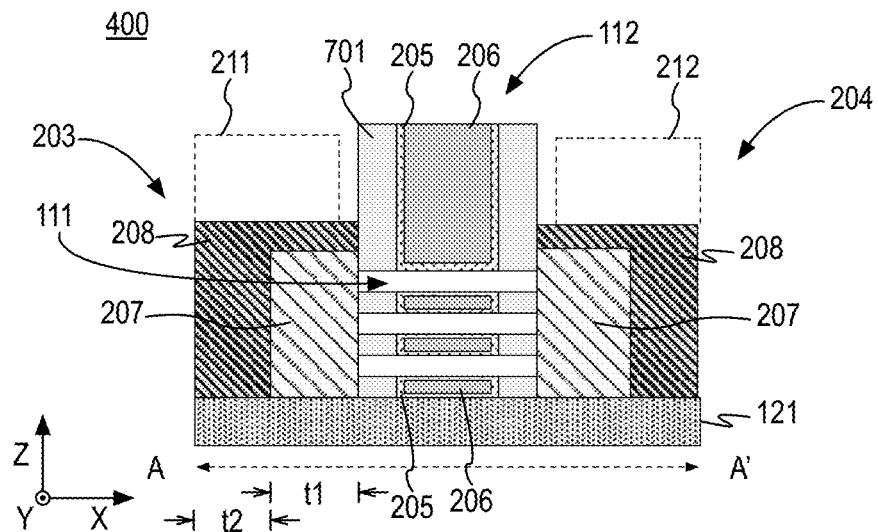
FIG. 7A illustrates a cross-sectional view through a length of the channel structure, source structure, and drain structure of the multiple epitaxial layer source and drain transistor of FIG. 4 having nano-sheet based channel structures.
Figure 7B:
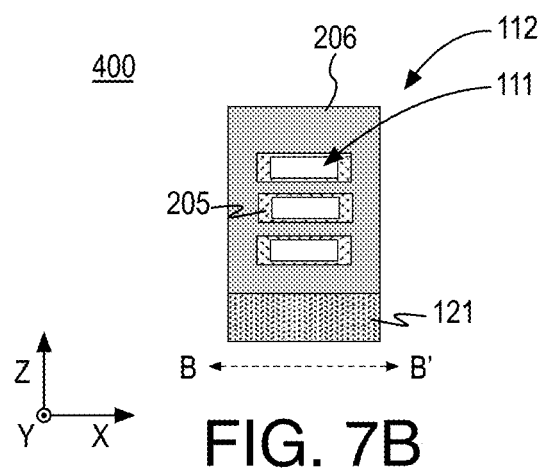
FIG. 7B illustrates a cross-sectional view through a width of the channel structure and gate structure of the multiple epitaxial layer source and drain transistor of FIG. 4 having nano-sheet based channel structures.

Notably, channel structure(s) 111 may be any suitable channel structures such as fin, any number of nanoribbons (also characterized as nanowires), any number of nano-sheets, or the like. For example, the fin, nanoribbons, or nano-sheets include crystalline semiconductor material (e.g., crystalline silicon) and source structure 203 and drain structure 204 include multiple epitaxial layers as discussed herein such that a first layer (i.e., layer 207) is on and epitaxial to the channel structure(s) 111 and a second layer (i.e., layer 208) is on and epitaxial to the first layer. For example, a fin channel structure may be a single high aspect ratio semiconductor material (e.g., having height in the z-direction not less than twice a width in the x-direction) extending between source structure 203 and drain structure 204 as shown in FIGS. 6A and 6B. Nano-sheet channel structures may include a number of semiconductor materials extending between source structure 203 and drain structure 204 as shown in FIGS. 7A and 7B. Similarly, nanoribbon channel structures may include a number of semiconductor materials extending between source structure 203 and drain structure 204 as shown in FIG. 5. Notably, nanoribbon channel structures and nanosheet channel structures may be similar with the exception that nanosheet channel structures typically have a greater aspect ratio (e.g., having width in the x-direction not less than twice a height in the z-direction). Such fin, nanoribbon, nanosheet channel structures may deploy the same materials for the same purposes and may be differentiated on the geometries of the structures deployed.

FIG. 5 illustrates an isometric view of example multiple epitaxial layer source and drain transistor 400 with the laterally grown source and drain structures removed to reveal channel structures 111, arranged in accordance with at least some implementations of the present disclosure. As shown in FIG. 5, multiple epitaxial layer source and drain transistor 400 may include nanowire channel structures 111 extending between source structure 203 and drain structure 204 (removed in FIG. 5 for illustrative purposes). In the illustrated example, nanowire channel structures 111 include three nanowire channel structures, however any number may be deployed such as four or more. Notably, nanowire channel structures 111 have an aspect ratio of height to width of about 1:1, however other aspect ratios may be used.

Also as shown, gate dielectric 205 substantially wraps around each of nanowire channel structures 111 to separate nanowire channel structures 111 from gate electrode 206, which surrounds each of nanowire channel structures 111 to provide control thereof in operation. Such wrap around structures provide high level gate control of nanowire channel structures 111. Epitaxial layer source and drain transistor 400, when using nanowire channel structures 111 may have any characteristics discussed herein inclusive of materials, dimensions, and so on. For example, each of source structure 203 and drain structure 204 may have multiple layers such that a first layer (i.e., layer 207) is on and epitaxial to nanowire channel structures 111 and a first layer (i.e., layer 207) is on and epitaxial to the first layer. In some embodiments, the first layer is crystalline silicon or crystalline silicon and carbon, and the second layer is crystalline germanium or crystalline silicon and germanium. Such layers may include any characteristics discussed herein with respect to layers 207, 208 inclusive of dopant concentrations, thicknesses, and so on.

FIG. 6A illustrates a cross-sectional view through a length of channel structure 111, source structure 203, and drain structure 204 of multiple epitaxial layer source and drain transistor 400 having a fin based channel structure along the A-A' plane shown in FIG. 4, arranged in accordance with at least some implementations of the present disclosure. FIG. 6B illustrates a cross-sectional view through a width of channel structure 111 and gate structure 112 of multiple epitaxial layer source and drain transistor 400 having a fin based channel structure along the B-B' plane shown in FIG. 4, arranged in accordance with at least some implementations of the present disclosure.

As shown in FIG. 6A, multiple epitaxial layer source and drain transistor 400 may include fin channel structure 111 extending between source structure 203 and drain structure 204. In the view of FIG. 6A, gate dielectric 205 is on a surface of channel structure 111. Gate dielectric 205 also substantially wraps around fin channel structure 111 orthogonal to the A-A' plane as shown in FIG. 6B. Furthermore, gate dielectric 205 separates fin channel structure 111 from gate electrode 206. In a similar manner, gate electrode 206 wraps around fin channel structure 111 to provide multi-gate control of fin channel structure 111 of multiple epitaxial layer source and drain transistor 400. Spacer dielectric 601 separates and electrically isolates gate structure 112 from source structure 203 and drain structure 204.

Returning to FIG. 6A, fin structure 202 of multiple epitaxial layer source and drain transistor 400 provides channel structure 111 that extends between source structure 203 and drain structure 204. In the illustrated embodiment, layer 207 is laterally grown epitaxially from fin structure 202 (refer to FIGS. 5 and 6). In some embodiments, first layer 207 is one of crystalline silicon or crystalline silicon and carbon, and second layer 208 is one of crystalline germanium or crystalline silicon and germanium. For example, first layer 207 may advantageously have a wider bandgap than second layer 208, as discussed herein. Layers 207, 208 may include any materials or characteristics discussed herein inclusive of crystalline materials, dopant impurities, dopant impurity concentrations, and so on. Notably, the discussed thickness of layers 207, 208 may be lateral thicknesses, t1 and t2, as shown.

FIGS. 6A and 6B illustrate an exemplary fin FET implementation of multiple epitaxial layer source and drain transistor 400. For example, such implementations may be used in IC system 100 or any other system or context discussed herein.

FIG. 7A illustrates a cross-sectional view through a length of channel structure 111, source structure 203, and drain structure 204 of multiple epitaxial layer source and drain transistor 400 having nano-sheet based channel structures along the A-A' plane shown in FIG. 4, arranged in accordance with at least some implementations of the present disclosure. FIG. 7B illustrates a cross-sectional view through a width of channel structure 111 and gate structure 112 of multiple epitaxial layer source and drain transistor 400 having nano-sheet based channel structures along the B-B' plane shown in FIG. 4, arranged in accordance with at least some implementations of the present disclosure.

As shown in FIG. 7A, multiple epitaxial layer source and drain transistor 400 may include nano-sheet channel structures 111 extending between source structure 203 and drain structure 204. In the view of FIG. 7A, gate dielectric 205 is on surfaces of nano-sheet channel structures 111. Gate dielectric 205 also substantially wraps around nano-sheet channel structures 111 orthogonal to the A-A' plane as shown in FIG. 7B. Furthermore, gate dielectric 205 separates fin channel structure 111 from gate electrode 206. In a similar manner, gate electrode 206 wraps around nano-sheet channel structures 111 to provide multi-gate control of nano-sheet channel structures 111 of multiple epitaxial layer source and drain transistor 400. Spacer dielectric 701 separates and electrically isolates gate structure 112 from source structure 203 and drain structure 204.

Channel structures 111 (e.g., comprising remaining materials of an etched multilayer fin) of multiple epitaxial layer source and drain transistor 400 extend between source structure 203 and drain structure 204. In the illustrated embodiment, layer 207 is laterally grown epitaxially from channel structures 111 (refer to FIGS. 5 and 6). In some embodiments, first layer 207 is one of crystalline silicon or crystalline silicon and carbon, and second layer 208 is one of crystalline germanium or crystalline silicon and germanium, as discussed herein. For example, first layer 207 may advantageously have a wider bandgap than second layer 208. Layers 207, 208 may include any materials or characteristics discussed herein inclusive of crystalline materials, dopant impurities, dopant impurity concentrations, and so on. Notably, the discussed thickness of layers 207, 208 may be lateral thicknesses, t1 and t2, as shown.

FIGS. 7A and 7B illustrate an exemplary nano-sheet FET implementation of multiple epitaxial layer source and drain transistor 400. For example, such implementations may be used in IC system 100 or any other system or context discussed herein. It is noted that nanoribbon FET implementation of multiple epitaxial layer source and drain transistor 400 may be similar to the nano-sheet FET implementation an aspect ratio of channel structures 111 in the x-z plane being one or close to one. For example, nanoribbon FET implementations may have a channel structure cross section as viewed in FIG. 7B that is substantially square.

As discussed, low temperature multiple epitaxial layer source and drain transistor integrated circuit system 100 is operable at a very low temperature as provided by environmental conditions and/or an active cooling structure. The active cooling structure may include any number of components or devices to remove heat from IC die 102 to achieve a very low operating temperature as discussed herein.

Figure 8:
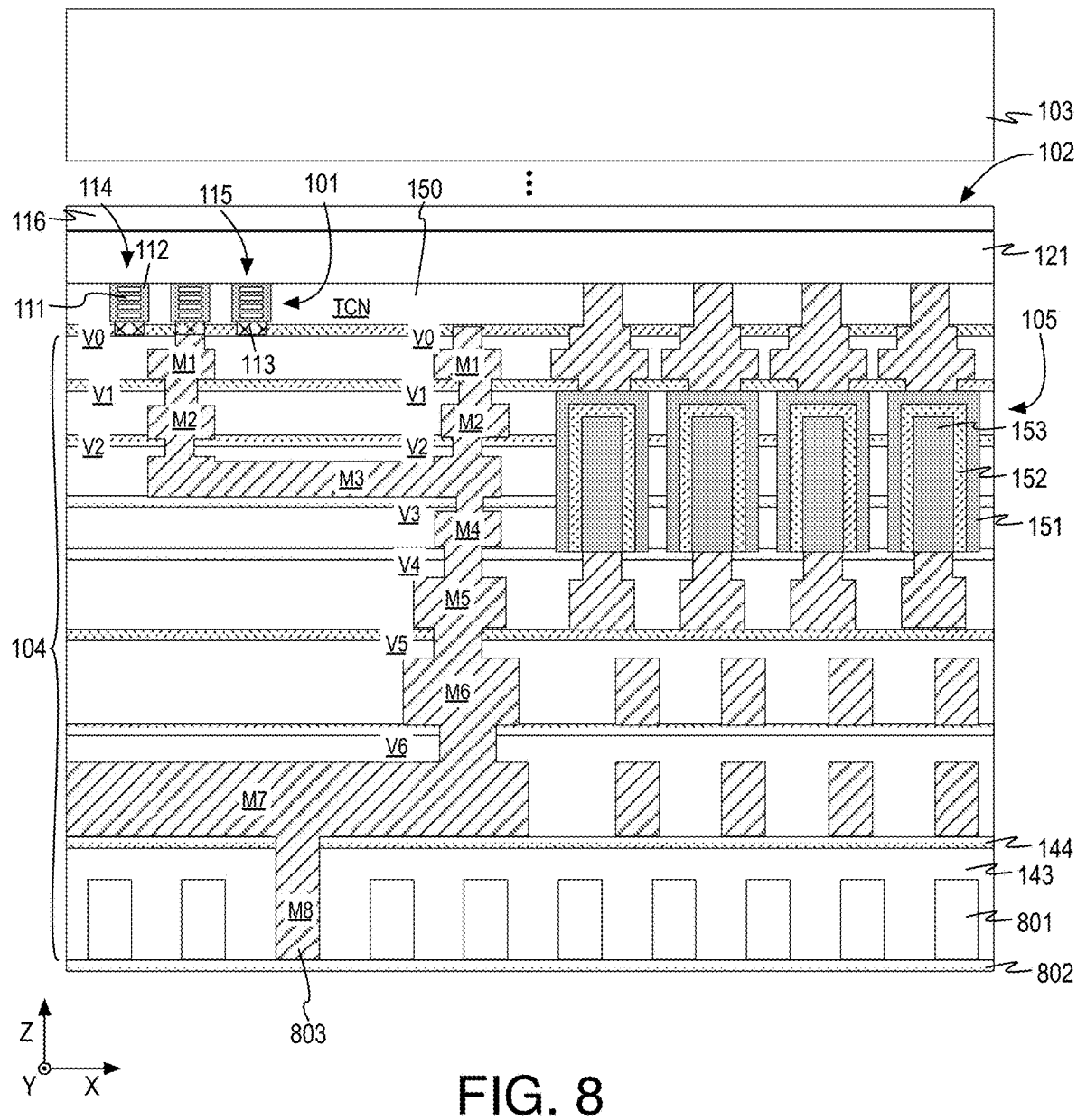
FIG. 8 illustrates a cross-sectional view of a low temperature multiple epitaxial layer source and drain transistor integrated circuit system using die level cooling.

FIG. 8 illustrates a cross-sectional view of a low temperature multiple epitaxial layer source and drain transistor integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 102 includes active cooling structures or components to remove heat from IC die 102 to achieve an operating temperature of IC die 102 at or below a target temperature such as 0° C. or any other operating or target temperature discussed herein.

In IC system 800, IC die 102 includes die level active cooling as provided by microchannels 801. Microchannels 801 are to convey a heat transfer fluid therein to remove heat from IC die 102. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M8. In other embodiments, microchannels 801 are implemented over metallization level M8. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 102 and over a number of front-side metallization layers 104. As discussed, microchannels 801 are to convey a heat transfer fluid therein.

In some embodiments, a metallization feature 803 of metallization layer M8 (and/or V7) is laterally adjacent to microchannels 801. For example, metallization feature 803 may couple to a package level interconnect structure (not shown) for signal routing for IC die 102. In the example of IC system 800, package level cooling structure 103 may be a passive heat removal device such as a heat sink or the like. As shown, in some embodiments, package level cooling structure 103 is deployed on or over a back-side of IC die 102. In some embodiments, package level cooling structure 103 is secured to IC die by adhesion layer 116. In some embodiments, package level cooling structure 103 is deployed on or over a front-side of IC die 102. In some embodiments, package level cooling structure 103 is not deployed in IC system 800.

Figure 9:
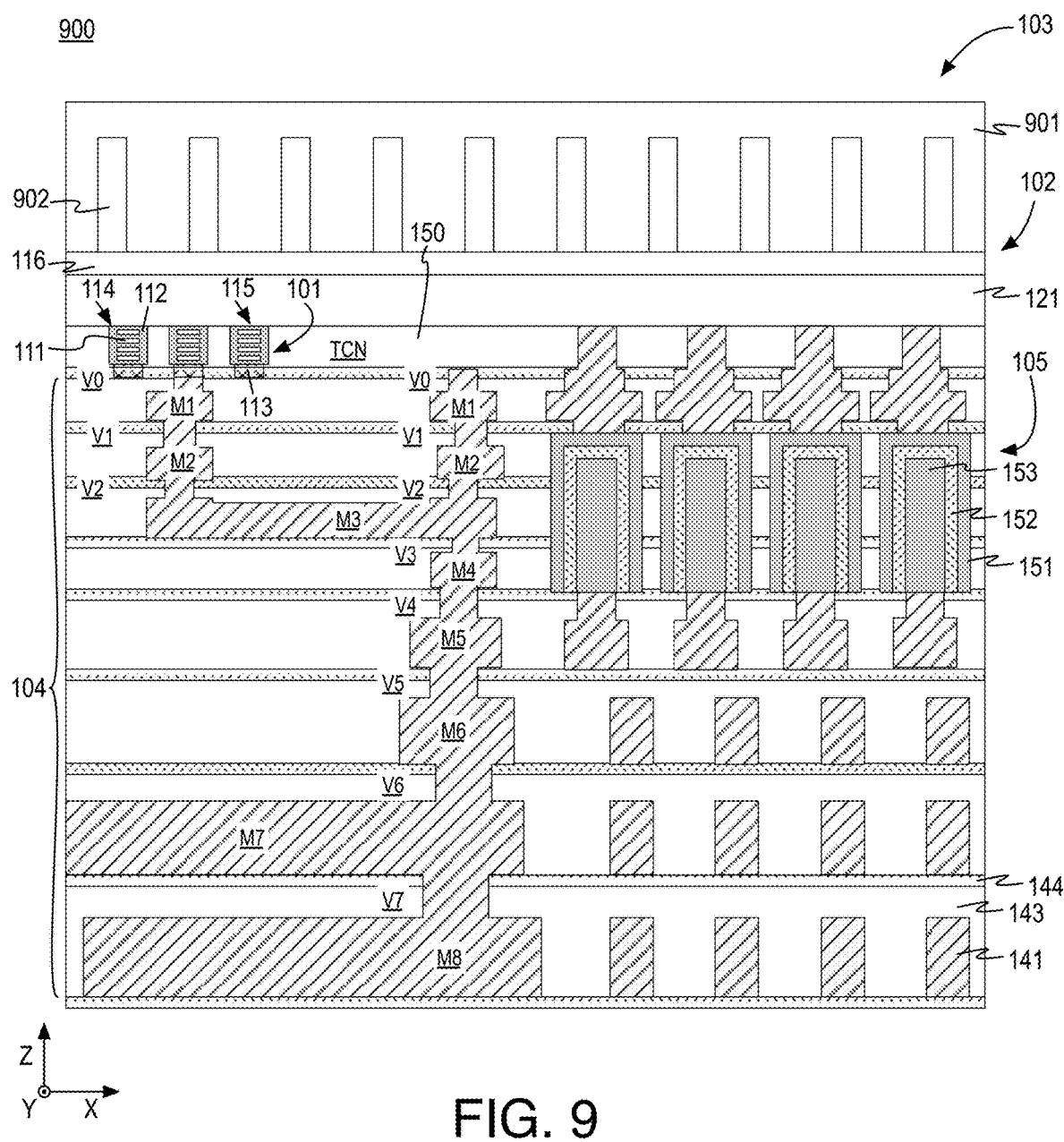
FIG. 9 illustrates a cross-sectional view of a low temperature multiple epitaxial layer source and drain transistor integrated circuit system using package level cooling.

FIG. 9 illustrates a cross-sectional view of a low temperature multiple epitaxial layer source and drain transistor integrated circuit system 900 using package level cooling, arranged in accordance with at least some implementations of the present disclosure. In the example of IC system 900, package level cooling structure 103 includes active cooling structures or components to remove heat from IC die 102 to achieve an operating temperature of IC die 102 at or below a target temperature such as 0° C. or any other operating or target temperature discussed herein.

In IC system 900, package level cooling structure 103 includes an active cooling structure 901 having microchannels 902. Microchannels 902 are to convey a heat transfer fluid therein to remove heat from IC die 102. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to a back-side of IC die 102 such that the chiller has a solid body having microchannels therein to convey a heat transfer fluid. In some embodiments, substrate 121 is thinned prior to application of package level cooling structure 103. In some embodiments, package level cooling structure 103 is attached over a front side of IC die 102 (e.g., over metallization layers 104). As discussed, in some embodiments, back side metallization may be provided opposite metallization layers 104.

Figure 10:
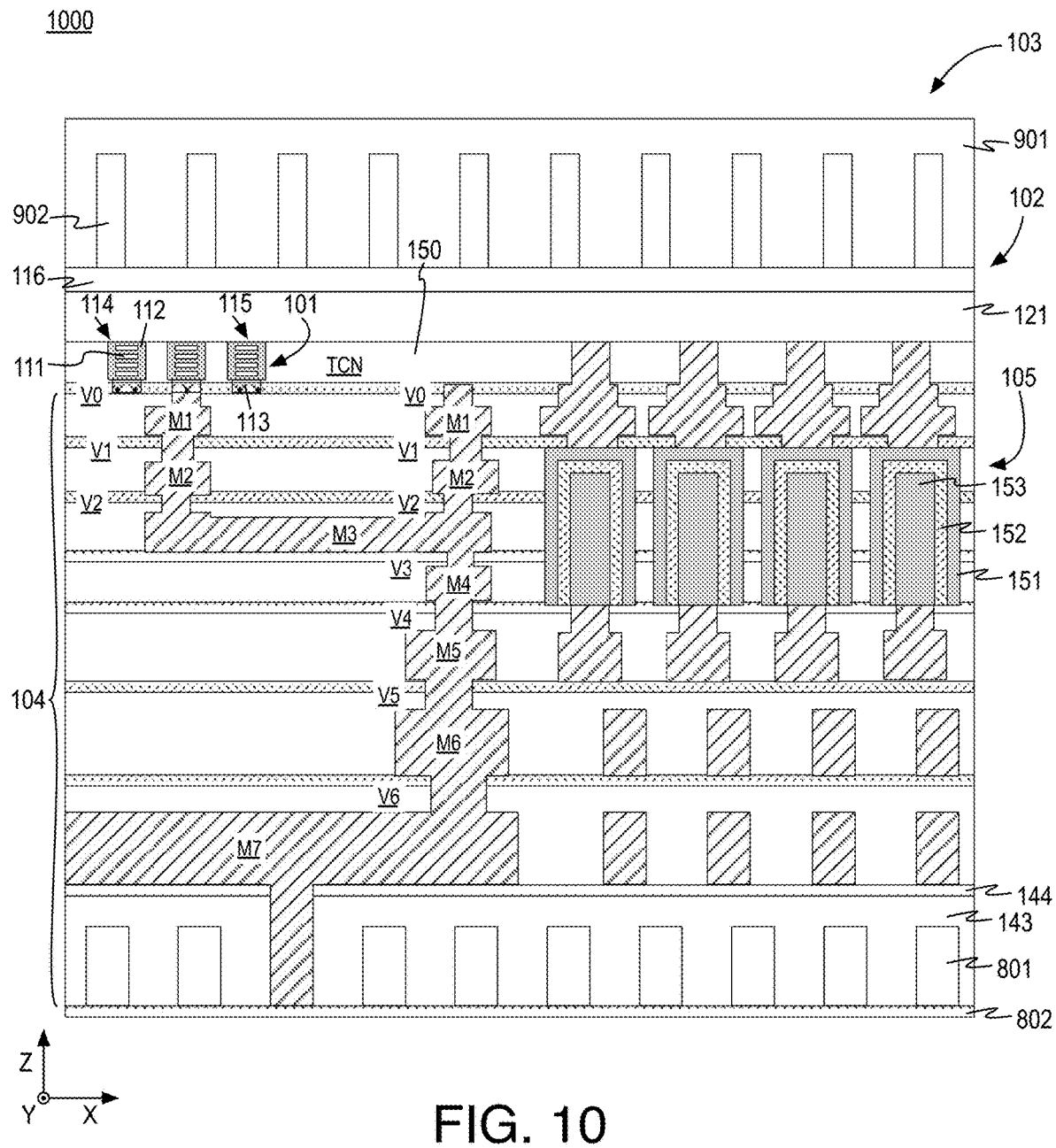
FIG. 10 illustrates a cross-sectional view of a low temperature multiple epitaxial layer source and drain transistor integrated circuit system using die level and package level cooling.

FIG. 10 illustrates a cross-sectional view of a low temperature multiple epitaxial layer source and drain transistor integrated circuit system 1000 using die level and package level cooling, arranged in accordance with at least some implementations of the present disclosure. In the example of IC system 1000, IC die 102 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed microchannels 801 and active cooling structure 901 may be the same or they may be different. Such embodiments may advantageously provide improved flexibility. In some embodiments, package level cooling structure 103 is attached over a back side of IC die 102 (e.g., over substrate 121, which may be thinned).

Figure 11:
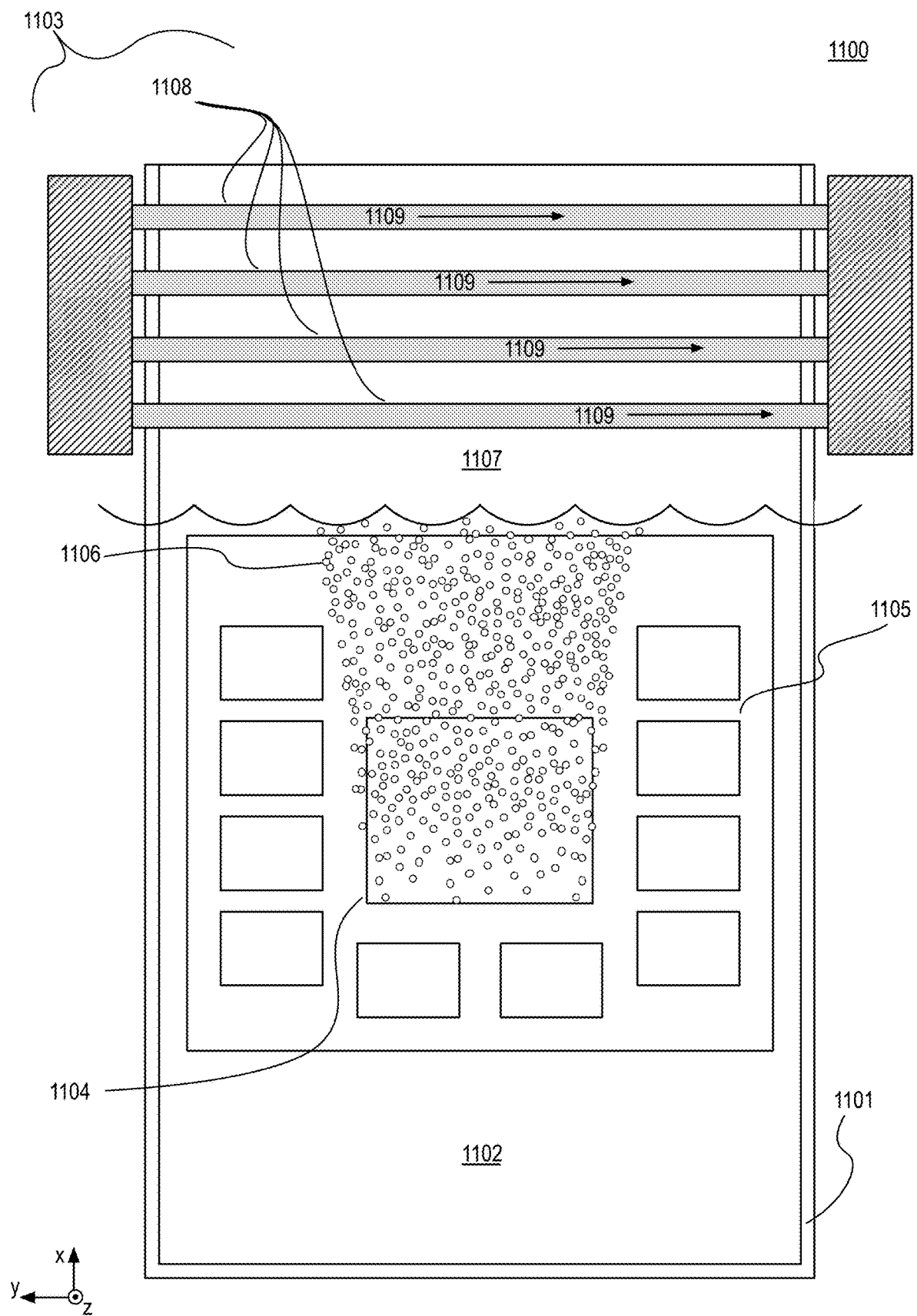
FIG. 11 illustrates a view of an example two-phase immersion cooling system for low temperature operation of an integrated circuit die having multiple epitaxial layer source and drain transistors.

FIG. 11 illustrates a view of an example two-phase immersion cooling system 1100 for low temperature operation of an integrated circuit die having multiple epitaxial layer source and drain transistors, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any of IC systems 100, 800 900, 1000 as discussed herein is immersed in low-boiling point liquid 1102. In some embodiments, IC systems 100, 800 900, 1000 as deployed in two-phase immersion cooling system 1100 do not include additional active cooling structures, although such die level or package level active cooling structures may be used in concert with two-phase immersion cooling system 1100. In some embodiments, when deployed in two-phase immersion cooling system 1100, package level cooling structure 103 is a heat sink, a heat dissipation plate, a porous heat dissipation plate or the like.

Notably, IC die 102, deploying one or more functional circuit blocks having multiple epitaxial layer source and drain transistor is the source of heat in the context of two-phase immersion cooling system 1100. For example, IC die 102 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 103 includes a passive cooling structure such as a heat sink for immersion in low-boiling point liquid 1102.

In some embodiments, package level cooling structure 103 includes an active cooling structure 901 having microchannels 902. Microchannels 902 are to convey a heat transfer fluid therein to remove heat from IC die 102. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to IC die 102 such that the chiller has a solid body having microchannels therein to convey a heat transfer fluid.

Figure 12:
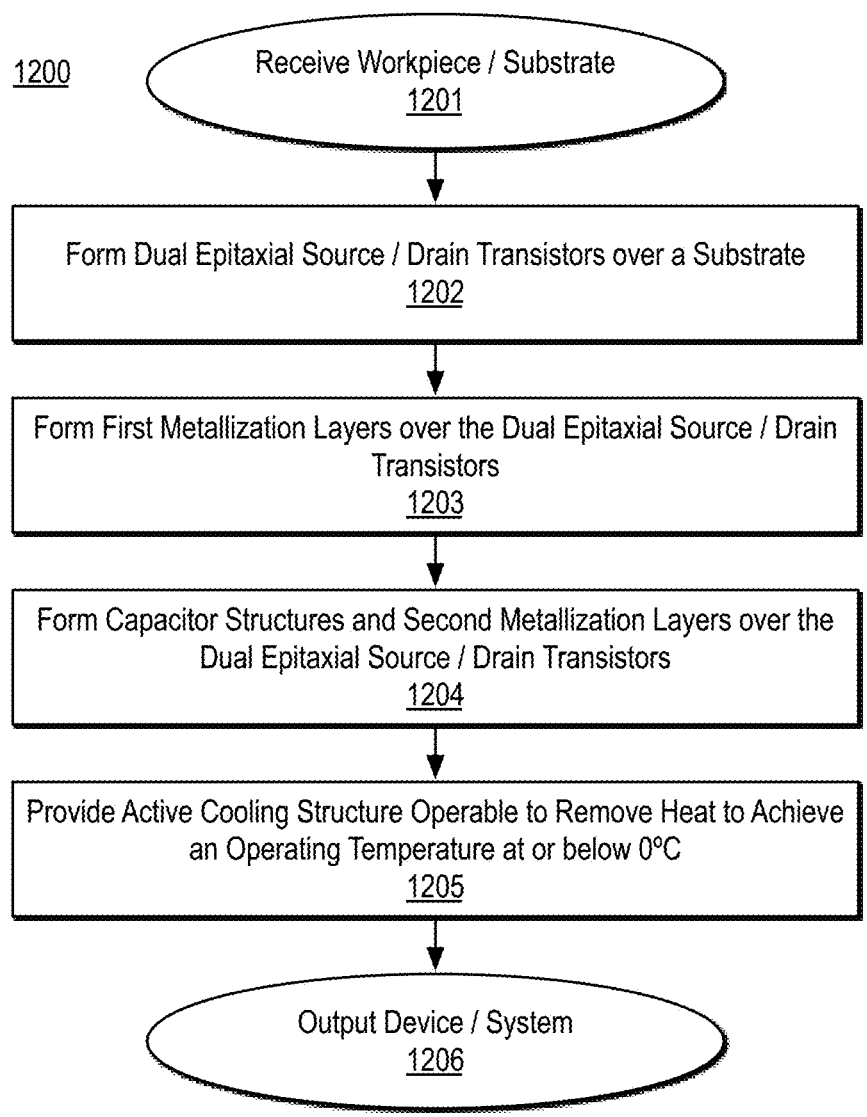
FIG. 12 is a flow diagram illustrating an example process 1200 for forming a multiple epitaxial layer source and drain transistor system.

FIG. 12 is a flow diagram illustrating an example process 1200 for forming a multiple epitaxial layer source and drain transistor system, arranged in accordance with at least some implementations of the present disclosure. As shown, process 1200 begins at operation 1201, where a workpiece or substrate is received for processing. The substrate may be any substrate discussed herein such as those discussed with respect to FIG. 1. In some embodiments, the substrate is a wafer.

Processing continues at operation 1202, where a number of transistors are formed over the substrate such that one or more of the transistors include a channel structure of crystalline silicon, a source and a drain coupled to the channel structure, and a gate structure between the source and the drain, such that the source or the drain includes a first layer epitaxial to the channel structure and a second layer epitaxial to the first layer, the first layer is crystalline silicon or crystalline silicon and carbon, and the second layer is crystalline germanium or crystalline silicon and germanium.

Such transistors may be formed using any suitable technique or techniques such as patterning techniques, etch techniques, deposition techniques, implant techniques, planarization techniques, and so on as known in the art. For example, of multiple epitaxial layer source and drain transistors 101 may be formed at operation 1202.

Processing continues at operation 1203, where a number of metallization layers are formed over the multiple epitaxial layer source and drain transistors. In some embodiments, the metallization layers are to provide signal and/or power routing for the multiple epitaxial layer source and drain transistors. The front-side metallization layers may be formed using any suitable technique or techniques such as dual damascene techniques, single damascene techniques, subtractive metallization patterning techniques, or the like. For example, front-side metallization layers 104 may be formed at operation 1203.

Processing continues at optional operation 1204, where a number of capacitors and additional metallization layers may be formed over a metallization layers formed at operation 1203. The capacitors and metallization layers may be formed using any suitable technique or techniques such as patterning techniques, etch techniques, deposition techniques, and so on as known in the art. For example, capacitors 105 and one or more of front-side metallization layers 104 may be formed at operation 1204.

Processing may continue with optional back side metallization formation. In some embodiments, back side metallization layers are deployed to provide power delivery for the multiple epitaxial layer source and drain transistors. The back-side metallization layers may be formed using any suitable technique or techniques. In some embodiments, after front-side processing, the front-side of the wafer is attached to a carrier substrate and back side removal processing (e.g., back-side grind or etch) is used to thin the wafer or remove the wafer entirely. The multiple epitaxial layer source and drain transistors may then be contacted from the back side using through via contacts. The back-side metallization layers are then formed using dual damascene, single damascene, subtractive metallization patterning, etc.

Processing continues at operation 1205, where an active cooling structure operable to remove heat from the multiple epitaxial layer source and drain transistors to achieve an operating temperature at or below 0° C. is provided. Any active cooling structure discussed herein may be provided at operation 1205. In the context of die level active cooling, die level active cooling microchannels may be formed on the front-side over the front-side metallization layers formed at operation 1203. As discussed such die level active cooling may be formed by etching the void structures of the microchannels followed by deposition techniques to enclose the void structures. For example, microchannels 801 to convey a heat transfer fluid therein may be formed at operation 1205.

In addition or in the alternative, a package level active cooling structure is provided. In some embodiments, active cooling structure 901 having microchannels 902 may be separately formed and attached to an IC die separated from the wafer received at operation 1201. For example, the wafer may be diced, each IC die may be packaged and an active cooling structure 901 may be attached thereto. In some embodiments, a two-phase immersion cooling system as discussed with respect to FIG. 11 is provided as the package level active cooling structure.

Processing continues at operation 1206, where the resultant device or system is output for use. As discussed, the active cooling structure is operable to maintain a very low temperature for the IC die, and the IC die deploys multiple epitaxial layer source and drain transistor system circuitry for improved device performance.

Figure 13:
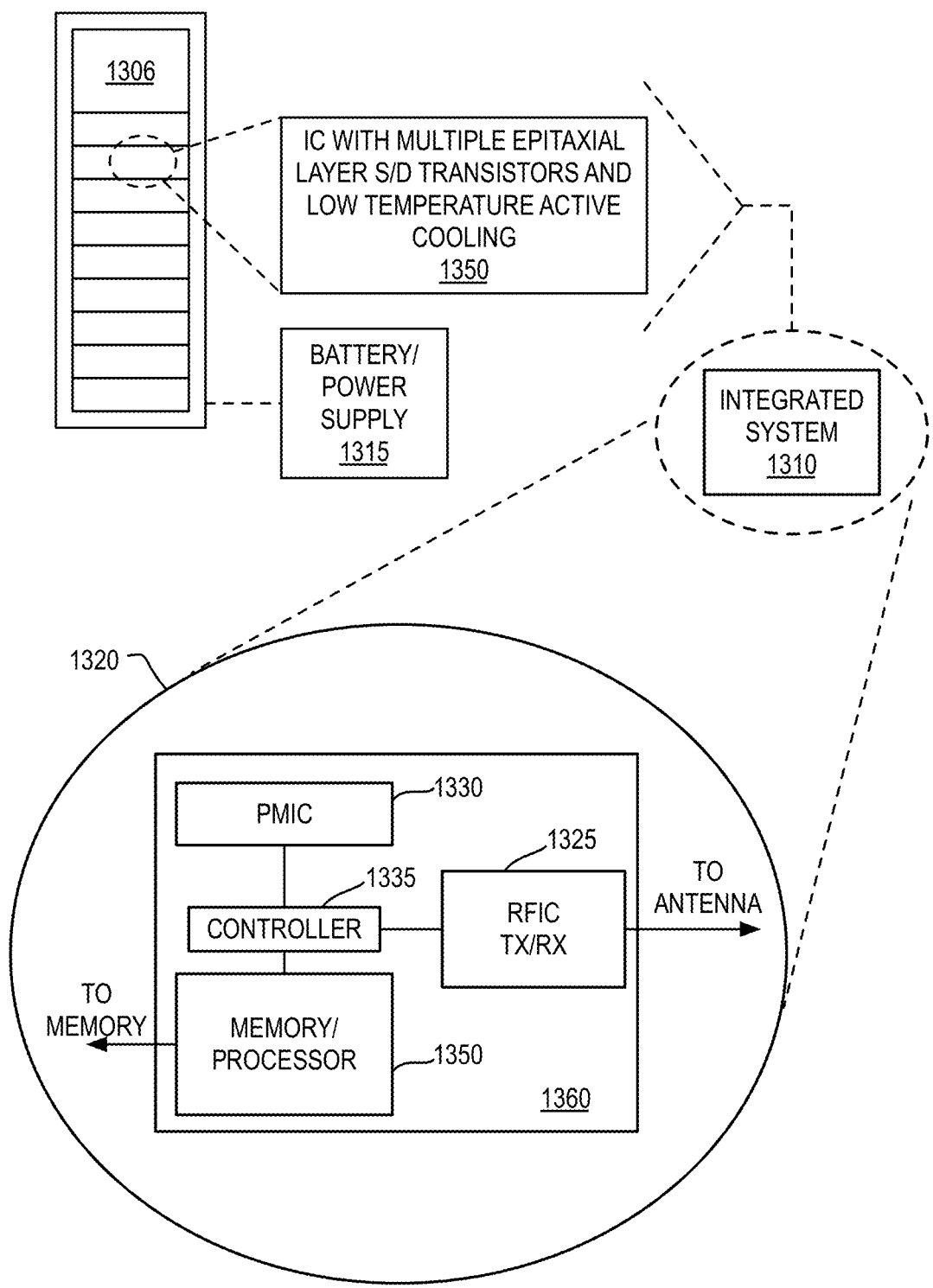
FIG. 13 illustrates diagram of an example data server machine employing a low temperature multiple epitaxial layer source and drain transistor integrated circuit system.

FIG. 13 illustrates diagram of an example data server machine 1306 employing a low temperature multiple epitaxial layer source and drain transistor integrated circuit system, arranged in accordance with at least some implementations of the present disclosure. Server machine 1306 may be any commercial server, for example, including any number of high-performance computing platforms disposed within a rack and networked together for electronic data processing, which in the exemplary embodiment includes one or more devices 1350 having an integrated circuit with functional circuit blocks having a number of multiple epitaxial layer source and drain transistors and low temperature active cooling operable to remove heat from the integrated circuit to achieve any low operating temperature discussed herein.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. Integrated system 1310 is further illustrated in the expanded view 1320. In the exemplary embodiment, devices 1350 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1350 is a microprocessor including an SRAM cache memory. As shown, device 1350 may employ a die or device having any transistor structures and/or related characteristics discussed herein. Device 1350 may be further coupled to (e.g., communicatively coupled to) a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335 thereof.

Figure 14:
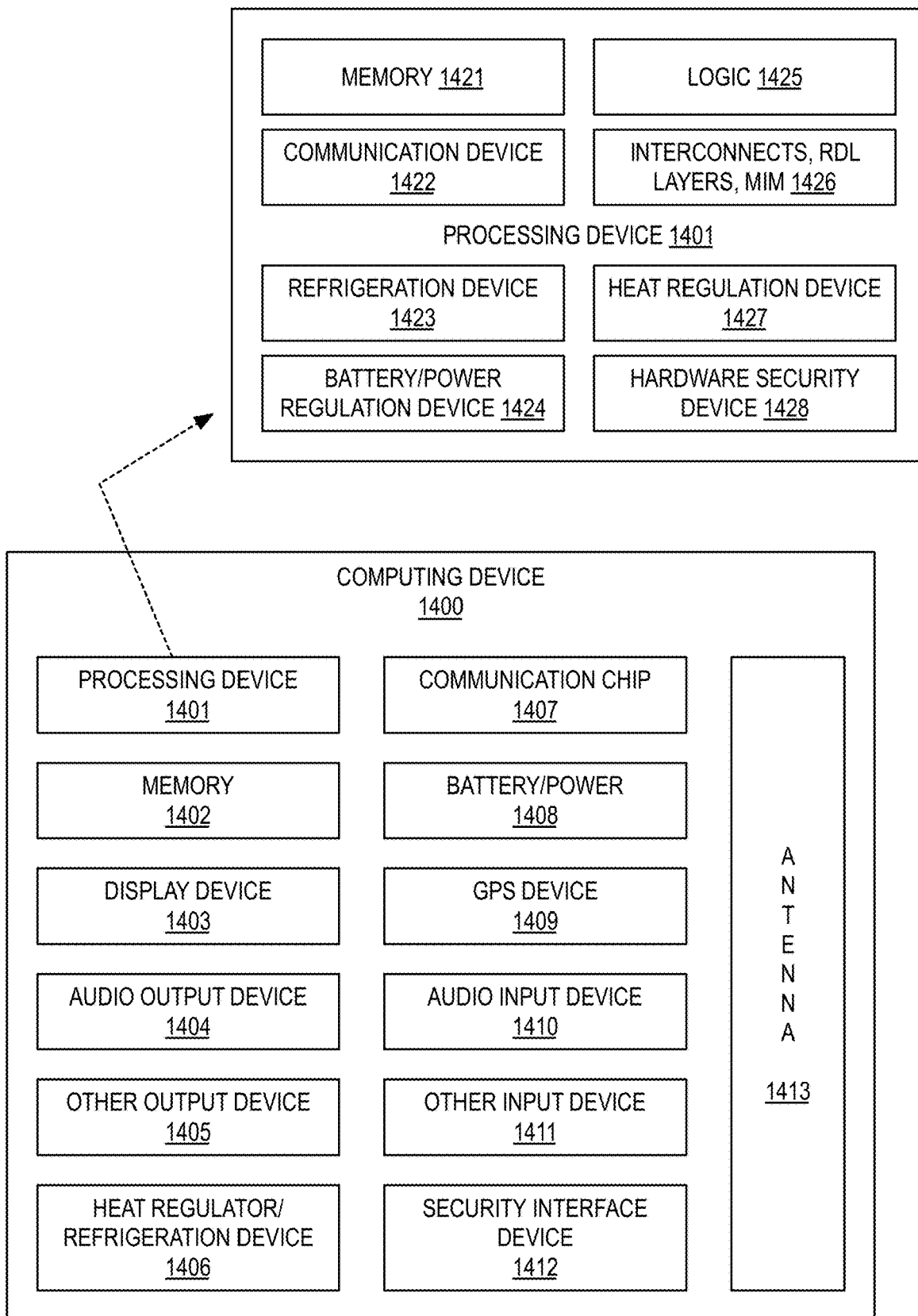
FIG. 14 is a block diagram of an example computing device, all arranged in accordance with at least some implementations of the present disclosure.

FIG. 14 is a block diagram of an example computing device 1400, arranged in accordance with at least some implementations of the present disclosure. For example, one or more components of computing device 1400 that may include any of the devices or structures discussed herein. A number of components are illustrated in FIG. 14 as included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled. In another set of examples, computing device 1400 may not include an audio Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1400 may include a memory 1402, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1402 includes memory that shares a die with processing device 1401. This memory may be used as cache memory and may include embedded dynamic random access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1401 (and/or other components of computing device 1400) at a predetermined low temperature during operation. This predetermined low temperature may be any temperature discussed herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include other output device 1405 (or corresponding interface circuitry, as discussed above). Examples of the other output device 1405 may include an audio codec, a video codec, a printer, a wired or wireless transmitter for providing information to other devices, or an additional storage device.

Computing device 1400 may include other input device 1411 (or corresponding interface circuitry, as discussed above). Examples of the other input device 1411 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, access list management, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following embodiments pertain to further embodiments.

In one or more first embodiments, an apparatus comprises an integrated circuit (IC) die comprising a plurality of transistors, an individual one of the transistors comprising a channel structure comprising crystalline silicon, a source and a drain coupled to the channel structure, wherein the source or the drain comprises a first layer epitaxial to the channel structure and a second layer epitaxial to the first layer, the first layer comprising crystalline silicon or crystalline silicon and carbon, and the second layer comprising crystalline germanium or crystalline silicon and germanium, and a gate structure between the source and the drain, and a cooling structure operable to remove heat from the IC die to achieve an operating temperature at or below −25° C.

In one or more second embodiments, further to the first embodiments, the first layer has a first dopant impurity concentration less than a second dopant impurity concentration of the second layer.

In one or more third embodiments, further to the first or second embodiments, the first layer is substantially absent dopant impurities.

In one or more fourth embodiments, further to the first through third embodiments, the individual one of the transistors is an NMOS transistor, and a PMOS transistor of the plurality of transistors comprises a second channel structure comprising crystalline silicon, and a second source and a second drain coupled to the second channel structure, such that the second source or the second drain comprises a third layer epitaxial to the second channel structure and a fourth layer epitaxial to the third layer, the fourth layer comprising a crystalline material having a greater germanium concentration than the second layer.

In one or more fifth embodiments, further to the first through fourth embodiments, the second layer comprises crystalline silicon and germanium and the fourth layer comprises crystalline germanium.

In one or more sixth embodiments, further to the first through fifth embodiments, the first layer comprises crystalline silicon and carbon having a carbon concentration in the range of 10^15/cm3 to 10^25/cm3.

In one or more seventh embodiments, further to the first through sixth embodiments, the first layer has a thickness of not more than 2 nm.

In one or more eighth embodiments, further to the first through seventh embodiments, the first layer comprises crystalline silicon and carbon, and the second layer comprises crystalline silicon and germanium.

In one or more ninth embodiments, further to the first through eighth embodiments, the IC die comprises a plurality of metallization layers over the plurality of transistors, and wherein the cooling structure is over the plurality of first metallization layers.

In one or more tenth embodiments, further to the first through ninth embodiments, the cooling structure comprises a plurality of microchannels in the IC die and over the plurality of metallization layers, the microchannels to convey a heat transfer fluid therein.

In one or more eleventh embodiments, further to the first through tenth embodiments, the cooling structure comprises a solid body comprising microchannels to convey a heat transfer fluid therein or a heat sink for immersion in a low-boiling point liquid.

In one or more twelfth embodiments, further to the first through eleventh embodiments, the transistors comprise field effect transistors (FETs) comprising one of Fin FETs, gate all around FETs, or recessed channel array transistors.

In one or more thirteenth embodiments, a memory device comprises an IC die according to any of the apparatuses of the first through twelfth embodiments, the IC die further including a capacitor coupled to one of the source or the drain.

In one or more fourteenth embodiments, a memory device comprises an integrated circuit (IC) die comprising a transistor comprising a channel structure comprising crystalline silicon, a source and a drain each comprising a first layer epitaxial to the channel structure and a second layer epitaxial to the first layer, the first layer comprising crystalline silicon or crystalline silicon and carbon, and the second layer comprising crystalline germanium or crystalline silicon and germanium, and a gate structure between the source and the drain, and a capacitor coupled to one of the source or the drain, and cooling structure operable to remove heat from the IC die to achieve an operating temperature at or below −25° C.

In one or more fifteenth embodiments, further to the fourteenth embodiments, the first layer has a first dopant impurity concentration less than a second dopant impurity concentration of the second layer.

In one or more sixteenth embodiments, further to the fourteenth or fifteenth embodiments, the transistor is an NMOS transistor, the first layer comprises crystalline silicon and carbon, and the second layer comprises crystalline silicon and germanium.

In one or more seventeenth embodiments, further to the fourteenth through sixteenth embodiments, the first layer comprises crystalline silicon and carbon having a carbon concentration in the range of 10^15/cm3 to 10^25/cm3.

In one or more eighteenth embodiments, further to the fourteenth through seventeenth embodiments, the cooling structure comprises one of a plurality of microchannels in the IC die, a solid body coupled to the IC die, the solid body comprising microchannels, or a heat sink for immersion in a low-boiling point liquid.

In one or more nineteenth embodiments, a method comprises forming a plurality of transistors over a substrate, an individual one of the transistors comprising a channel structure comprising crystalline silicon, a source and a drain coupled to the channel structure, wherein the source or the drain comprises a first layer epitaxial to the channel structure and a second layer epitaxial to the first layer, the first layer comprising crystalline silicon or crystalline silicon and carbon, and the second layer comprising crystalline germanium or crystalline silicon and germanium, and a gate structure between the source and the drain, forming a plurality of metallization layers over the transistors, and providing an cooling structure operable to remove heat from the transistors to achieve an operating temperature at or below −25° C.

In one or more twentieth embodiments, further to the nineteenth embodiments, the first layer has a first dopant impurity concentration less than a second dopant impurity concentration of the second layer.

In one or more twenty-first embodiments, further to the nineteenth or twentieth embodiments, the transistor is an NMOS transistor, the first layer comprises crystalline silicon and carbon, and the second layer comprises crystalline silicon and germanium.

In one or more twenty-second embodiments, further to the nineteenth through twenty-first embodiments, the method further comprises forming a capacitor coupled to one of the source or the drain.

In one or more twenty-third embodiments, further to the nineteenth through twenty-second embodiments, providing the cooling structure comprises forming a plurality of microchannels over the metallization layers, the microchannels to convey a heat transfer fluid therein.

In one or more twenty-fourth embodiments, further to the nineteenth through twenty-third embodiments, providing the cooling structure further comprises dicing an integrated circuit (IC) die from the substrate and coupling a chiller to the IC die.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
   an integrated circuit (IC) die comprising a plurality of transistors, wherein an NMOS transistor of the plurality of transistors comprises:
   a first channel structure comprising crystalline silicon;
   a first source and a first drain coupled to the first channel structure, wherein the first source or the first drain comprises a first layer epitaxial to the first channel structure and a second layer epitaxial to the first layer, the first layer comprising crystalline silicon or crystalline silicon and carbon, and the second layer comprising crystalline germanium or crystalline silicon and germanium; and
   a first gate structure between the first source and the first drain; and
   a PMOS transistor of the plurality of transistors comprises:
   a second channel structure comprising crystalline silicon; and
   a second source and a second drain coupled to the second channel structure, wherein the second source or the second drain comprises a third layer epitaxial to the second channel structure and a fourth layer epitaxial to the third layer, the fourth layer comprising a crystalline material having a greater germanium concentration than the second layer; and
   a cooling structure operable to remove heat from the IC die to achieve an operating temperature at or below −25° C.

2. The apparatus of claim 1, wherein the first layer has a first dopant impurity concentration less than a second dopant impurity concentration of the second layer.

3. The apparatus of claim 2, wherein the first layer is substantially absent dopant impurities.

4. The apparatus of claim 1, wherein the second layer comprises crystalline silicon and germanium and the fourth layer comprises crystalline germanium.

5. The apparatus of claim 1, wherein the first layer comprises crystalline silicon and carbon having a carbon concentration in a range of $10^{15}/cm^3$ to $10^{25}/cm^3$.

6. The apparatus of claim 1, wherein the first layer has a thickness of not more than 2 nm.

7. The apparatus of claim 1, wherein the first layer comprises crystalline silicon and carbon, and the second layer comprises crystalline silicon and germanium.

8. The apparatus of claim 1, wherein the IC die comprises a plurality of metallization layers over the plurality of transistors, and wherein the cooling structure is over the plurality of metallization layers.

9. The apparatus of claim 8, wherein the cooling structure comprises a plurality of microchannels in the IC die and over the plurality of metallization layers, the microchannels to convey a heat transfer fluid therein.

10. The apparatus of claim 8, wherein the cooling structure comprises a solid body comprising microchannels to convey a heat transfer fluid therein or a heat sink for immersion in a low-boiling point liquid.

11. The apparatus of claim 1, wherein the transistors comprise field effect transistors (FETs) comprising one of Fin FETs, gate all around FETs, or recessed channel array transistors.

12. The apparatus of claim 1, wherein the IC die further comprises a capacitor coupled to one of the first source, the first drain, the second source, or the second drain.

13. An apparatus, comprising:
    an integrated circuit (IC) die comprising
    an NMOS transistor comprising a first channel structure comprising crystalline silicon, a first source and a first drain coupled to the first channel structure, wherein the first source or the first drain comprises a first layer lattice matched to the first channel structure and a second layer lattice matched to the first layer, the first layer comprising crystalline silicon or crystalline silicon and carbon, and the second layer comprising crystalline germanium or crystalline silicon and germanium, and a first gate structure between the first source and the first drain; and
    a PMOS transistor comprising a second channel structure comprising crystalline silicon, a second source and a second drain coupled to the second channel structure, wherein the second source or the second drain comprises a third layer lattice matched to the second channel structure and a fourth layer lattice matched to the third layer, the fourth layer comprising a crystalline material having a greater germanium concentration than the second layer, and a second gate structure between the second source and the second drain; and a cooling structure operable to remove heat from the IC die to achieve an operating temperature at or below −25° C.

14. The apparatus of claim 13, wherein the first layer has a first dopant impurity concentration less than a second dopant impurity concentration of the second layer.

15. The apparatus of claim 14, wherein the first layer is substantially absent dopant impurities.

16. The apparatus of claim 13, wherein the second layer comprises crystalline silicon and germanium and the fourth layer comprises crystalline germanium.

17. The apparatus of claim 13, wherein the first layer comprises crystalline silicon and carbon having a carbon concentration in a range of $10^{15}/cm^3$ to $10^{25}/cm^3$.

18. The apparatus of claim 13, wherein the first layer comprises crystalline silicon and carbon, and the second layer comprises crystalline silicon and germanium.

19. The apparatus of claim 13, wherein the IC die comprises a plurality of metallization layers over the NMOS transistor and the PMOS transistor, and wherein the cooling structure is over the plurality of metallization layers.

20. The apparatus of claim 19, wherein the cooling structure comprises a plurality of microchannels in the IC die and over the plurality of metallization layers, the microchannels to convey a heat transfer fluid therein.

21. The apparatus of claim 19, wherein the cooling structure comprises a solid body comprising microchannels to convey a heat transfer fluid therein or a heat sink for immersion in a low-boiling point liquid.

22. The apparatus of claim 13, wherein the NMOS transistor and the PMOS transistor comprise field effect transistors (FETs) comprising one of Fin FETs, gate all around FETs, or recessed channel array transistors.

23. The apparatus of claim 13, wherein the IC die further comprises a capacitor coupled to one of the first source, the first drain, the second source, or the second drain.

* * * * *